(12) United States Patent  (10) Patent No.: US 7,656,726 B2
Cheng et al.  (45) Date of Patent: Feb. 2, 2010

(54) MEMORY WITH IMPROVED BIST

(75) Inventors: Wei-Chia Cheng, Hsinchu (TW);
Chen-Hui Hsieh, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 302 days.

(21) Appl. No.: 11/563,459

(22) Filed: Nov. 27, 2006

(65) Prior Publication Data

US 2008/0126901 A1  May 29, 2008

(51) Int. Cl.
*G11C 29/00* (2006.01)
(52) U.S. Cl. .................. 365/200; 365/201; 365/189.04
(58) Field of Classification Search ................. 365/200, 365/201, 189.04, 230.03, 191, 189.08, 189.02, 365/189.03
See application file for complete search history.

(56) References Cited

U.S. PATENT DOCUMENTS

| | | | |
|---|---|---|---|
| 6,104,731 A * | 8/2000 | Chow | .......................... 370/537 |
| 6,216,241 B1 | 4/2001 | Fenstermaker et al. | |
| 6,512,709 B1 * | 1/2003 | Nakahara et al. | ............ 365/200 |
| 6,941,499 B1 | 9/2005 | Sung et al. | |
| 2003/0030073 A1 * | 2/2003 | Saotome et al. | ............ 257/202 |
| 2004/0213058 A1 * | 10/2004 | Shimizu et al. | ............ 365/200 |
| 2005/0007172 A1 * | 1/2005 | Sadakata et al. | ............ 327/202 |
| 2005/0157565 A1 * | 7/2005 | Lee | ........................ 365/189.05 |
| 2006/0190215 A1 | 8/2006 | Hsieh et al. | |
| 2007/0007985 A1 * | 1/2007 | Motomochi | .................. 324/765 |

* cited by examiner

*Primary Examiner*—Dang T Nguyen
(74) *Attorney, Agent, or Firm*—Duane Morris LLP

(57) ABSTRACT

An integrated circuit device includes an embedded memory having a plurality of memory macros and a built-in-self-test (BIST) circuit coupled to the plurality of memory macros for simultaneous operation of the memory macros, wherein the BIST circuit is configured to select from the memory macros' data outputs an individual memory macro's data output for analysis while the memory macros are operated simultaneously.

14 Claims, 3 Drawing Sheets

MEMORY WITH IMPROVED BIST

FIELD OF THE INVENTION

The present invention relates to embedded memory, and more particularly to memories having built-in self-test circuits.

BACKGROUND OF THE INVENTION

As deep sub-micron ASIC and IC technology evolves, greater numbers of IC devices are being designed and fabricated with embedded memories. Device testing involves applying a stimulus to a device under test, to acquire the device's response, and to analyze and compare that response with a known good (non-faulty) response.

Embedded memories include a plurality of memory macros, such as RAM memory macros. As these macros are individually accessible during normal system operation, all memory macros potentially may be accessed at the same time. Each macro is surrounded by intervening circuitries including, for example, logic elements, and input/output (I/O) interface circuits. As a result, the embedded macro modules are not directly accessible from the input and output terminals of an integrated circuit chip. Under access conditions, noise can be generated by these circuitries. Therefore, it is important to test the macros under the noisiest of conditions, i.e., when all memory macros are accessed simultaneously.

FIG. 1 show a prior art memory testing system 100 utilizing external automatic test equipment (ATE) 150 for providing the stimulus to the embedded RAM macros 120 of the IC 110. In the embodiment shown in FIG. 1, an external bus structure 140 is required for providing the stimulus from the ATE 150 to each of the I/O pads 130. The tester examines the device response to stimulus and compares it against the known good response that has been stored in the tester as part of the test pattern data. This approach has several disadvantages. In order to allow access to each macro 120, a number of extra pin pads 130 are required. The external bus structure 140 connecting to these numerous pin pads 130 is necessarily very complex. Further, the tester program for the ATE is very complex and thus difficult to program. Still further, the I/O pads 130 often have a limited frequency operating range (e.g., 100 MHz) that is less than the high operating speed (e.g., 200 MHz) of the IC 110. Therefore, tests cannot be run at the true operating speed of the IC 110.

As an alternative to the complex external bus structure 140, complex design-for-test (DFT) circuitry can be employed. Essentially, some of I/O 130 is replaced with intricate databases structures within the IC 110. Due to its complexity, this solution is also unattractive.

Another approach to verifying the corrected operation of an IC device is the built-in self-test (BIST) circuit. BIST circuits place the function of the external, automated tester within the IC chip itself. In a BIST circuit, a finite state machine (FSM) is used to generate stimulus and to analyze the response of the part of the integrated circuit that is under test. The BIST circuitry also interfaces with the higher-level system.

FIG. 2 is a diagram an IC 110A having a plurality of memory macros 120 and a plurality of associated BIST modules 160. One instance of BIST 160 is assigned for each instance of memory macro 120. Through an external trigger, all of the BISTs 160 are caused to operate simultaneously. This approach has significant design concerns, due mostly to the large amount of area overhead that is consumed. Not only do the BIST modules 160 consume area, but they consume routing area resources. The area required for the routing structure connecting each BIST module 160 to its respective memory macro 120 is no longer available for use by other routing resources.

Therefore, improved BIST designs are desired.

SUMMARY OF THE INVENTION

An integrated circuit device includes an embedded memory having a plurality of memory macros and a built-in-self-test (BIST) circuit coupled to the plurality of memory macros for simultaneous operation of the memory macros, wherein the BIST circuit is configured to select from the memory macros' data outputs an individual memory macro's data output for analysis while the memory macros are operated simultaneously.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
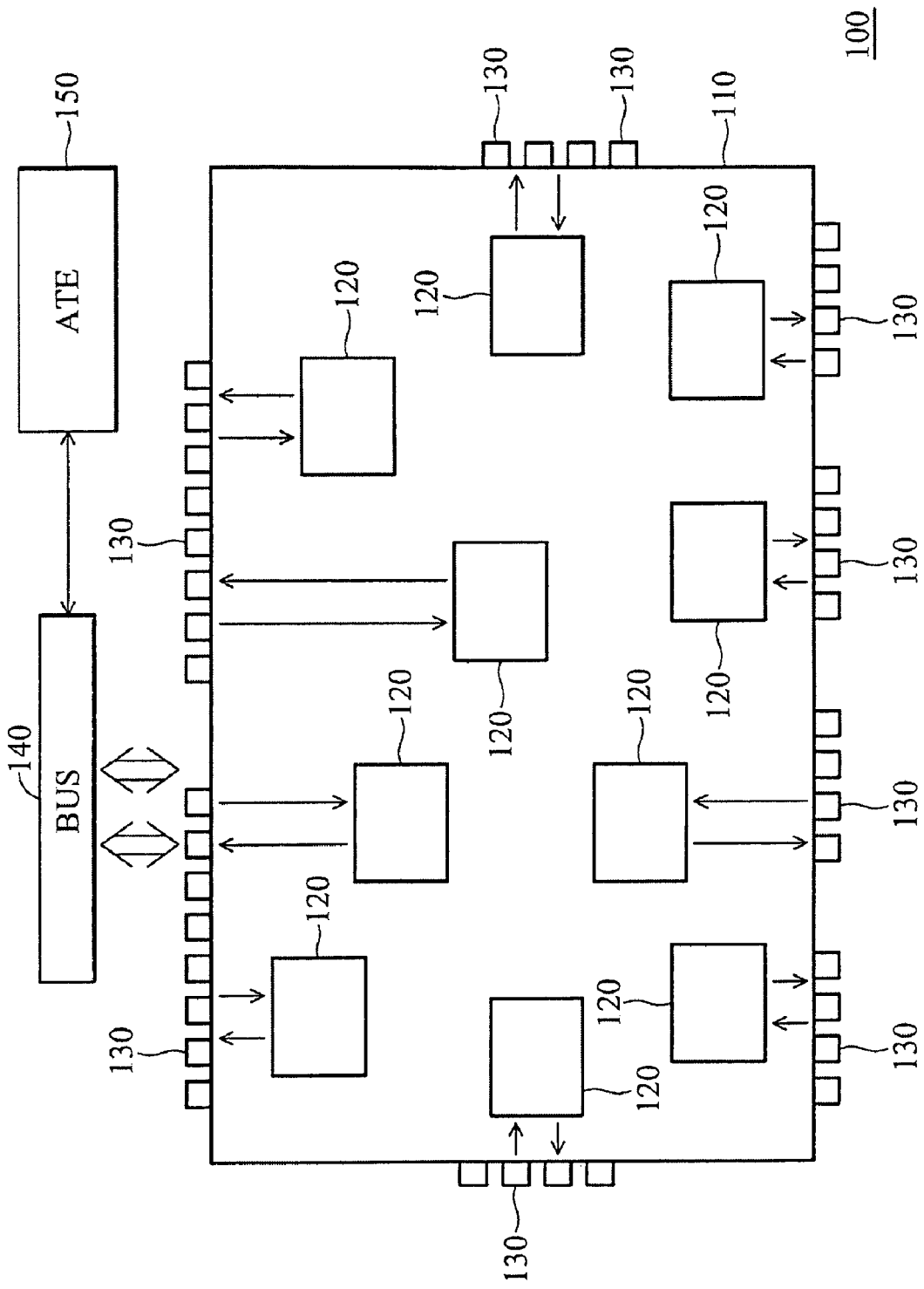
FIG. 1 is a schematic diagram of a prior art testing system for an IC utilizing automatic test equipment.
Figure 2:
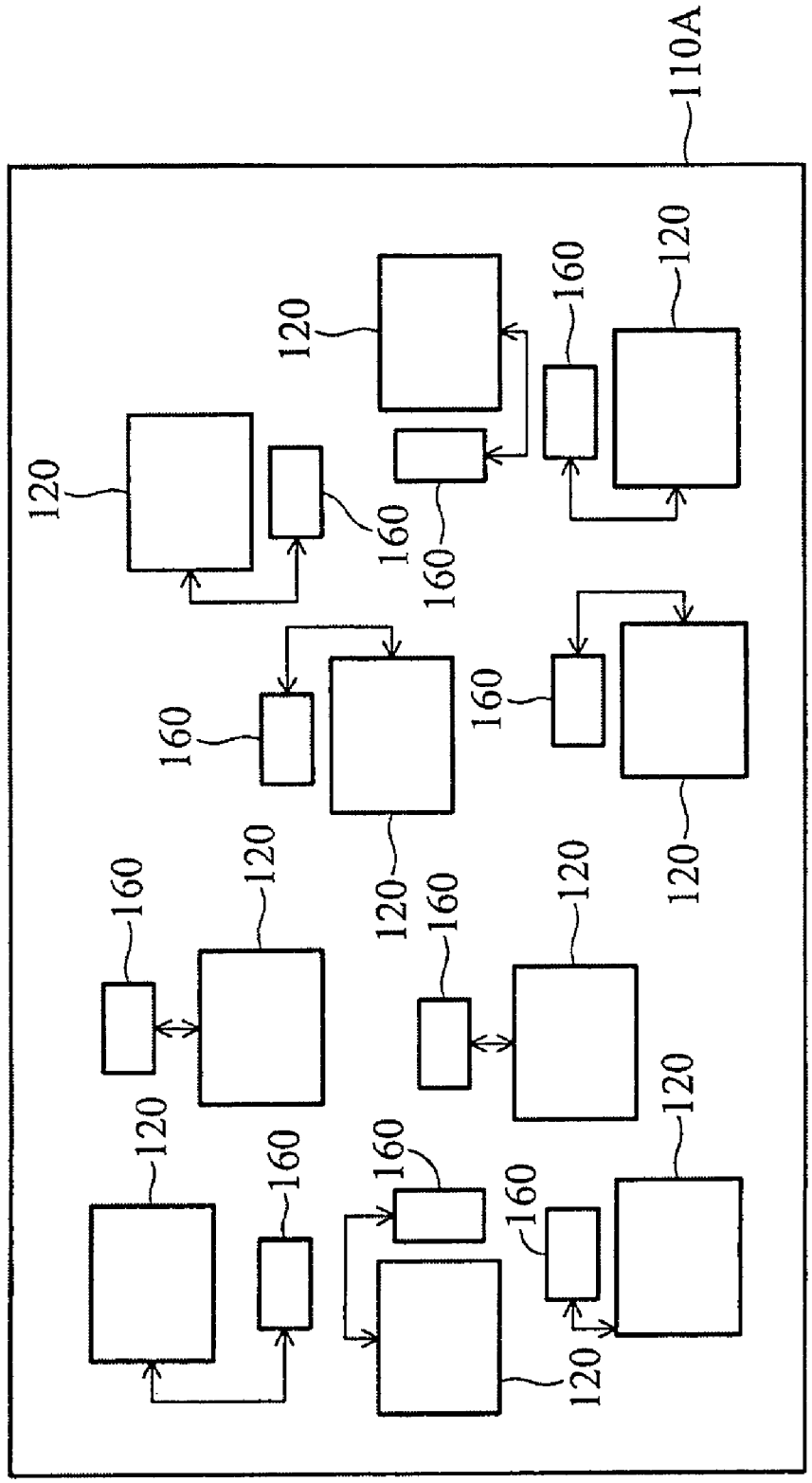
FIG. 2 is a schematic diagram of a prior art IC having a plurality of instances of built-in-self-test circuitry.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

An improved BIST structure is provided for IC's having embedded memories. The BIST provides commands and data as stimulus to all of the memory macros simultaneously, thereby achieving the same operating environment as the real application. By stressing all of the memory macros simultaneously, noise effect can be observed and memory defects due to this effect can be uncovered. At the same time, the approach ensures that adequate current is supplied for all memory macros during operation and allows for current measurement and characterization in a realistic simulated environment.

Figure 3:
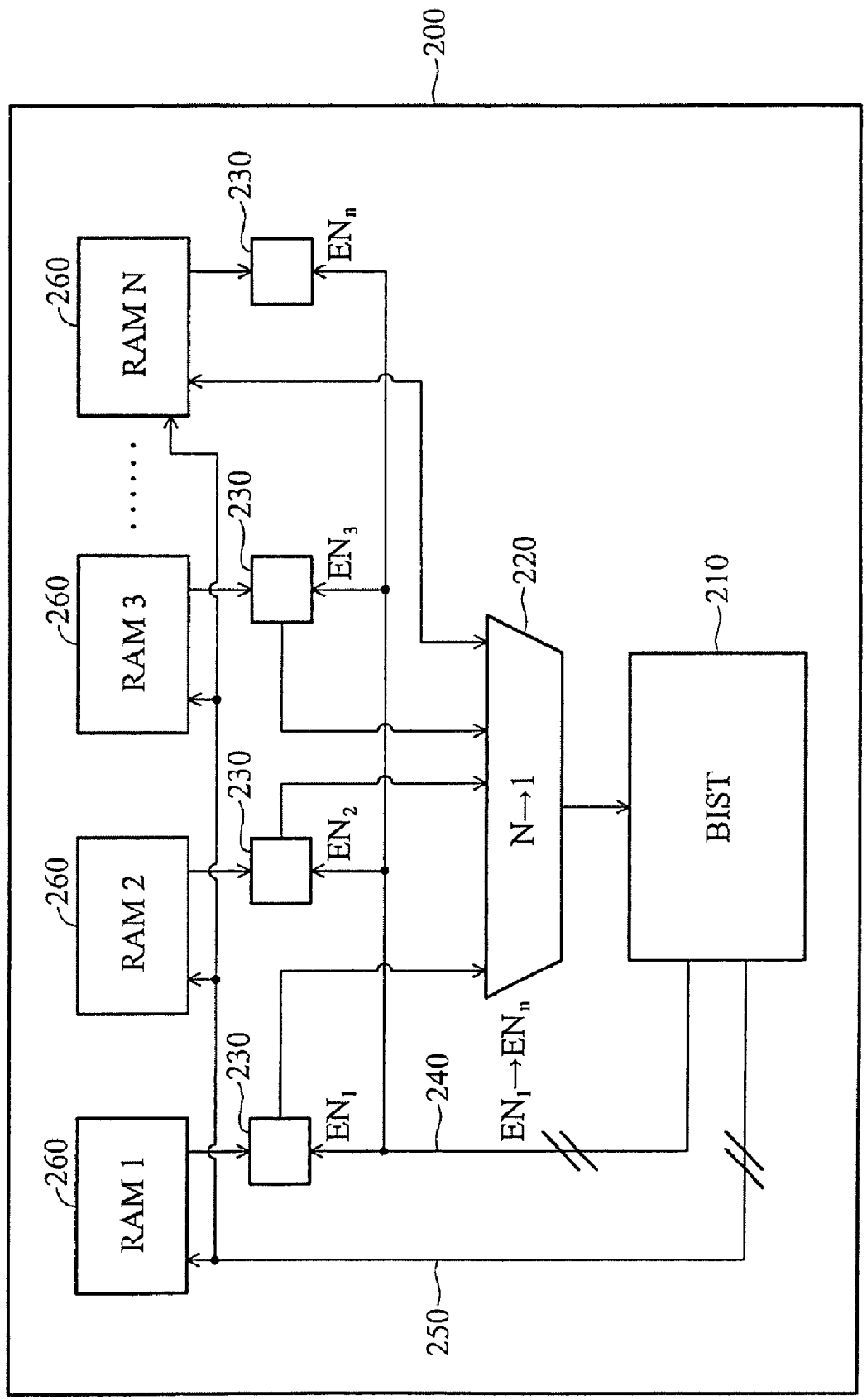
FIG. 3 is a schematic diagram of an IC having improved BIST structure according to the present invention.

FIG. 3 is a schematic diagram of an integrated circuit (IC) device 200 having embedded memory with built-in-self-test (BIST) circuitry according to an embodiment of the present invention. The embedded memory of the IC 200 includes a plurality of memory macros 260, shown as modules "RAM 1" to "RAM N". The structure and function of the RAM macros are familiar to those skilled in the art. Each macro typically includes about 1 megabit (Mb) of memory cells. So, for example, a cell phone memory having 6 Mbs of memory would include 6 embedded memory macros.

The IC 200 includes a BIST circuit 210 for testing the plurality of memory macros 260. In preferred embodiments, one instance of BIST is provided for a group of memory macros. As shown in FIG. 3, a single BIST circuit 210 is included for providing stimulus for testing the plurality of memory macros 260. The BIST circuit activates or stresses the memory macros 260 through data and input control lines 250 connected between the output of the BIST circuit 210 and the inputs of the macros 260. In exemplary embodiments, the BIST activates the macros 260 simultaneously and provide data and read/write commands via lines 250.

The IC 200 includes a logic circuit coupling the outputs of the macros 260 to the input of the BIST circuit 210 under control of the BIST circuit 210. In one embodiment, the logic circuit includes a plurality of output gates 230, one for each of the memory macros 260. The outputs of the memory macros 260 are coupled to a multiplexer 220 or other N-to-1 gate structure, which couples the outputs to the input of the BIST circuit 210. The gates 230 are controlled via enable control signals EN1:ENn provided by BIST circuit 210. Specifically, the gates latch or pass the outputs of the memory macros 260 to the multiplexer 220 under control of the enable signals. The output of the multiplexer 220 is coupled to the input of the BIST circuit 210. Those skilled in the art will understand that there are numerous means by which a particular output can be selected by the BIST 210 for analysis and the present invention is not limited to the structure shown in FIG. 3. In one embodiment, the output gates 230 are latches that receive enabling signals that produce tri-state results when disabled. This embodiment allows all macro outputs to be wired together without using the multiplexer or N-to-1 gate 220. Only one set of memory output would be enabled, leaving the other memory outputs in tri-state, thereby providing only the enabled set to the BIST 210. Alternatively, the multiplexer or N-to-1 gate 230 can be used without gates 230. In this embodiment, the multiplexer is responsive to the enable signals for selecting an output set to be passed to the BIST 210 for analysis.

It will be understood that the BIST circuit 210 is coupled to an external I/O pad (not shown) for receiving a control signal triggering its operation. As will be understood by those skilled in the art, the BIST circuit 210 is configured to provide data and control signals via line 250 to test macros 260. The BIST circuit 210 then compares the output data from the macros against predetermined expected results. Since BIST 210 is coupled to each of the macros 260, the single BIST 210 can simultaneously stimulate/operate each memory macro 260. However, via enable signals EN and gates 230, only the output data from one of the macros is selected at any time for input to the multiplexer 220, and thus for input to BIST 210 for analysis according to its programming. In embodiments, the macros are each tested to evaluate the device, such as sequentially or using some other defined pattern.

The architecture of FIG. 3 allows for the accurate emulation of the use of the IC 200 during its expected operation, allowing the detection of defects due to noise or current drop when multiple memory macros are active. The BIST circuit 210 executes read/write commands for all of the macros in order to generate noise effect, but only the output from one targeted macro is obtained at a time for result comparison by the BIST 210. Testing is also accomplished at the operating frequency of the IC 200, leading to a more accurate representation of the true operating environment of the IC 200. The advantages of the new BIST system are provided without high overhead penalties, as only one BIST is required for groups of macros and the logic structure does not consume much area. The BIST approach is relatively simple to implement from both function and routing points of view and does not require complex tester programs and external busses or extra pin pads.

As described above, the worst case current and noise scenarios are emulated by operating all macros simultaneously. Since all of the memory macros 260 can be made to operate simultaneously, the operating current during this operation can be measured. Operating current can be measured by probing the current at the power pads of the IC 200 using a tester, as will be understood by those skilled in the art. The tester provides power through the power pads to enable the IC 200, and current can be measured on those power pads. This is useful because the IC 200 is designed to work within a certain specified power range. If the actual operating current is measured while all memory macros are accessed, it can be identified whether a detected failure is due to power consumption or due to the internal circuit design within the IC.

Although only one BIST circuit 210 is shown in FIG. 3, it should be understood that multiple BIST circuits may be provided in IC 200, with each BIST circuit associated with a plurality of memory macros 260. Also, although memory macros 260 are shown as RAM macros, the memory macros may also be ROM, PROM or other memory macros, or combinations thereof. Also, though the macros are shown as memory macros, there BIST structure and methodology described herein can be configured to test disparate circuit modules, such as a memory macro and other operational modules or components of an ASIC.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An integrated circuit device comprising:
    an embedded memory comprising a plurality of memory macros, each memory macro comprising a plurality of memory cells, each memory macro having a data input and a data output;
    a built-in-self-test (BIST) circuit coupled to said plurality of memory macros for simultaneous operation of said memory macros; and
    a plurality of latch gates coupled between the data outputs of said macros and the BIST circuit, wherein said latch gates are responsive to enable control signals from said BIST circuit to latch data from the data output of an individual memory macro selected by said BIST circuit to said BIST circuit for analysis,
    wherein said BIST circuit is configured to select from said memory macros' data outputs an individual memory macro's data output for analysis while said memory macros are simultaneously operated.

2. The integrated circuit device of claim 1, further comprising an N-to-1 logic gate having a plurality of inputs coupled to said plurality of latch gates and an output coupled to said BIST circuit, wherein the N-to-1 logic gate passes the latched data from the data output of the individual memory macro selected by the BIST circuit to the BIST circuit for analysis.

3. The integrated circuit device of claim 2, wherein said logic gate is a multiplexer.

4. The integrated circuit device of claim 1, wherein said BIST circuit provides data and control signals for operating said plurality of memory macros simultaneously.

5. The integrated circuit device of claim 1, wherein said memory macros are RAM macros.

6. A method of testing embedded memory within an integrated circuit device, said embedded memory including a plurality of memory macros, said method comprising the steps of:
- simultaneously operating said plurality of memory macros with a built-in-self-test (BIST) circuit;
- providing output data from said memory macros to a plurality of latch gates:
- selecting a memory macro from said plurality of memory macros for analysis with said BIST circuit;
- latching the output data from the latch gate associated with the selected memory macro to said BIST circuit under control of said BIST circuit; and
- analyzing the data output data from said selected memory macro with said BIST circuit.

7. The method of claim 6, wherein said selecting step comprises providing an enable control signal for the latch gate associated with said selected memory macro with said BIST circuit.

8. The method of claim 6, further comprising the step of after analyzing the output data from said selected memory macro, selecting a second memory macro for analysis with said BIST circuit and analyzing output data from said second selected memory macro with said BIST circuit.

9. The method of claim 6, further comprising the step of measuring current provided to said plurality of memory macros during said simultaneous operation.

10. An integrated circuit device comprising:
- a plurality of operational modules;
- a built-in-self-test (BIST) circuit coupled to said plurality of operational modules, said BIST circuit providing data and control signals to said operational modules for simultaneous operation of said modules; and
- a logic circuit coupled between outputs of said modules and said BIST circuit, said logic circuit selectively passing outputs from said modules to said BIST circuit under control of said BIST circuit, wherein said BIST circuit is configured to select respective modules' outputs through said logic circuit for analysis during said simultaneous operation, wherein said logic circuit comprises:
- a plurality of gates associated with said plurality of operational modules, each gate having an input coupled to a respective operational module and an output, wherein each gate is responsive to control signals from said BIST circuit for passing data from said respective module to its output; and
- an N-to-1 gate having inputs coupled to outputs of said gates and an output coupled to said BIST circuit to pass data received from the gates to the BIST circuit for analysis.

11. The integrated circuit of claim 10, wherein said operational modules comprise a plurality of memory macros of an embedded memory.

12. The integrated circuit device of claim 10, wherein said N-to-1 gate is a multiplexer.

13. The integrated circuit device of claim 10, wherein said memory macros are RAM macros.

14. The integrated circuit of claim 1, wherein the latch gates are tri-state enabled, wherein outputs of said latch gates are wired together to an input of the BIST circuit, wherein latch gates associated with unselected data outputs assume a high-impedance state.

* * * * *

UNITED STATES PATENT AND TRADEMARK OFFICE
CERTIFICATE OF CORRECTION

PATENT NO.         : 7,656,726 B2
APPLICATION NO.    : 11/563459
DATED              : February 2, 2010
INVENTOR(S)        : Wei-Chia Cheng and Chen-Hui Hsieh It is certified that error appears in the above-identified patent and that said Letters Patent is hereby corrected as shown below:

Column 5, line 13, Claim 6, after "gates" delete ":" and insert -- ; --.

Column 5, line 20, Claim 6, after "analyzing the" delete "data".

Signed and Sealed this

Thirteenth Day of April, 2010

David J. Kappos
*Director of the United States Patent and Trademark Office*